United States Patent
Ware et al.

(10) Patent No.: US 9,824,779 B2
(45) Date of Patent: Nov. 21, 2017

(54) MEMORY ERROR REPAIR

(71) Applicant: Rambus Inc., Sunnyvale, CA (US)

(72) Inventors: Frederick A. Ware, Los Altos Hills, CA (US); Vlad Fruchter, Los Altos, CA (US); Chi-Ming Yeung, Cupertino, CA (US)

(73) Assignee: Rambus Inc., Sunnyvale, CA (US)

( * ) Notice: Subject to any disclaimer, the term of this patent is extended or adjusted under 35 U.S.C. 154(b) by 211 days.

(21) Appl. No.: 14/717,048

(22) Filed: May 20, 2015

(65) Prior Publication Data

US 2015/0339202 A1 Nov. 26, 2015

Related U.S. Application Data

(60) Provisional application No. 62/001,895, filed on May 22, 2014.

(51) Int. Cl.

| | | |
|---|---|---|
| *G11C 29/00* | (2006.01) | |
| *G11C 29/56* | (2006.01) | |
| *G06F 11/07* | (2006.01) | |
| *G06F 3/06* | (2006.01) | |
| *G11C 29/44* | (2006.01) | |
| *G06F 11/10* | (2006.01) | |
| *G11C 29/52* | (2006.01) | |
| *G11C 5/04* | (2006.01) | |
| *G11C 11/401* | (2006.01) | |

(52) U.S. Cl.
CPC ............ *G11C 29/765* (2013.01); *G11C 29/88* (2013.01); *G06F 3/0629* (2013.01); *G06F 11/0751* (2013.01); *G06F 11/1008* (2013.01); *G11C 5/04* (2013.01); *G11C 11/401* (2013.01); *G11C 29/44* (2013.01); *G11C 29/4401* (2013.01); *G11C 29/52* (2013.01); *G11C 29/56008* (2013.01); *G11C 2029/4402* (2013.01)

(58) Field of Classification Search
CPC .......... G11C 11/401; G11C 2029/4402; G11C 29/765; G11C 29/88; G11C 5/04; G11C 29/52; G11C 29/44; G11C 29/4401; G11C 29/56008; G06F 11/0751; G06F 3/0629; G06F 11/1008
See application file for complete search history.

(56) References Cited

U.S. PATENT DOCUMENTS

| | | |
|---|---|---|
| 8,099,570 B2 | 1/2012 | O'Conner et al. |
| 8,484,529 B2 | 7/2013 | Alves et al. |
| 9,042,191 B2 * | 5/2015 | O'Connell .......... G06F 11/1064 365/185.09 |

(Continued)

*Primary Examiner* — Cynthia Britt
*Assistant Examiner* — Sazzad Hossain
(74) *Attorney, Agent, or Firm* — The Neudeck Law Firm, LLC

(57) ABSTRACT

In response to a first memory access transaction having a first base address, data fields and a repair fields are retrieved from a first DRAM channel. The data fields include a first data field. The repair fields include a first repair field storing repair data. The repair data is to replace any data in the first data field. In response to a second memory access transaction having a second base address, repair tag fields are retrieved from a second DRAM channel. The repair tag fields include a repair tag field that indicates the repair data is be replace the data stored in the first data field.

20 Claims, 9 Drawing Sheets

(56) References Cited

U.S. PATENT DOCUMENTS

| | | | |
|---|---|---|---|
| 2012/0173921 A1* | 7/2012 | Wuu | G11C 29/846 |
| | | | 714/6.21 |
| 2012/0173936 A1* | 7/2012 | Johnson | G06F 11/1044 |
| | | | 714/718 |
| 2012/0182821 A1 | 7/2012 | Perego | |
| 2013/0191685 A1 | 7/2013 | Stephens et al. | |
| 2013/0191698 A1* | 7/2013 | Meaney | G06F 11/1004 |
| | | | 714/758 |
| 2014/0082453 A1* | 3/2014 | Sikdar | G11C 29/808 |
| | | | 714/763 |

\* cited by examiner

MEMORY ERROR REPAIR

CROSS-REFERENCE TO RELATED APPLICATIONS

This application claims the benefit of U.S. Provisional Application Ser. No. 62/001,895, filed May 22, 2014, and titled MEMORY ERROR REPAIR, which is hereby incorporated herein by reference for all purposes.

DETAILED DESCRIPTION OF THE EMBODIMENTS

Figure 1:
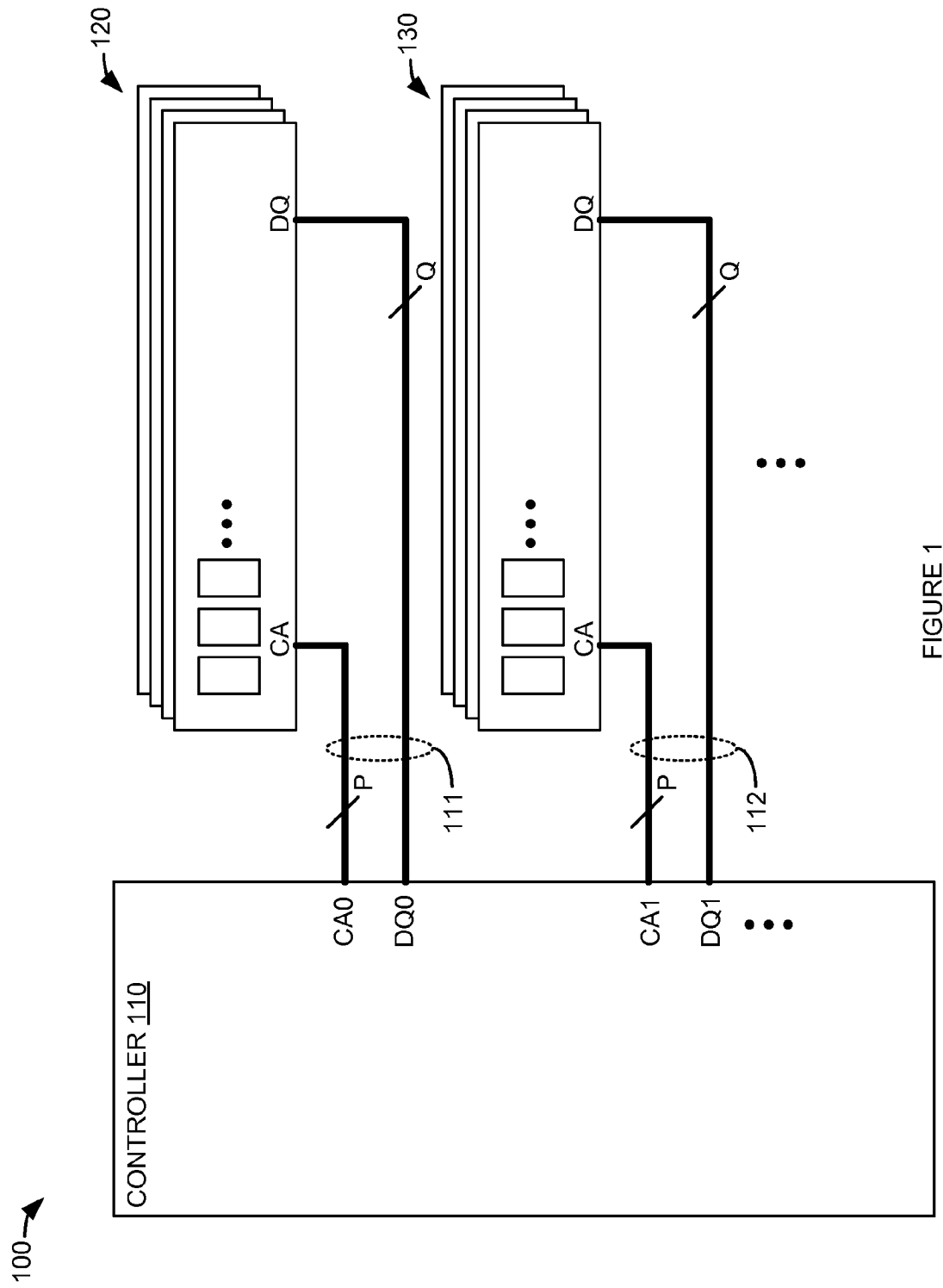
FIG. 1 is a block diagram illustrating a memory system.

In an embodiment, parallel accesses are made on two memory channels. The first access on the first channel retrieves a block of data. This data block includes data repair elements that can be substituted for bad data elements in the rest of the data block. The parallel access on the second channel retrieves a block of repair tags. The block of repair tags is the same size as the data block so the two accesses can take place with the same timing. In another embodiment, data block and repair tag block accesses are made on the same memory channel, but at different times and to different addresses.

The repair tags specify which (if any) bad data elements in the data block are to be replaced by data repair elements from the same data block. The repair tags also specify which data repair elements are used to repair the bad data element(s). Each block of repair tags covers multiple data blocks. Accordingly, the repair tags also each specify which block of data a respective repair tag applies to. By dedicating a portion of each data block to data repair elements, the memory system can provide error free storage at memory error rates that are much greater than a single error correct double error detect (SECDED) error detect and correct (EDC) code system can tolerate.

For example, take a system with memory channels that are reading 72 bit wide dual in-line memory modules (DIMMs) in eight word bursts. If each burst is a data block, each data block and each repair tag block will have 72 bytes. In each of these 72 byte data blocks, 64 bytes can be allocated to data, 13 nibbles (i.e., 13 4-bit fields) allocated as data repair elements, and three nibbles allocated as to hold a (576, 564) SECDED code protecting the entire data block. Likewise, in each 72 byte repair tag block, 64 bytes can be allocated as 32 repair tags, 13 nibbles can be used for other purposes (e.g., reserved for future use), and three nibbles allocated to hold a (576, 564) SECDED code protecting the entire repair tag block. Each repair tag block can supply the repair tags for 16 data blocks.

Each of the repair tags can have an enable bit, an address field that specifies which data block the tag applies to, an address field that gives the location of the repair element in that data block corresponding to this tag, and an address field to specify the location of the nibble in the data block that is to be replaced with the specified repair element. These allocations allow up to 13 nibbles in given data block, and up to 32 nibbles spread over 16 contiguous data blocks (8 kB), to be repaired.

FIG. 1 is a block diagram illustrating a memory system. In FIG. 1, memory system 100 comprises controller 110, memory modules 120, and memory modules 130. Controller 120, the devices on memory modules 120, and the device on memory modules 130 are integrated circuit type devices, such as are commonly referred to as a "chips". A memory controller, such as controller 110, manages the flow of data going to and from memory devices and/or memory modules. A memory controller can be a separate, standalone chip, or integrated into another chip. For example, a memory controller may be included on a single die with a microprocessor, or included as part of a more complex integrated circuit system such as a block of a system on a chip (SOC).

Memory modules 120 are operatively coupled to controller 110 via a command/address bus (i.e., CA0) and a data bus (i.e., DQ0). Bus CA0 comprises of P number of signal lines (e.g., 28). Bus DQ0 comprises of Q number of signal lines (e.g., 72). Together, command/address bus CA0 and data bus DQ0 comprise a first memory channel 111. Memory modules 130 are operatively coupled to controller 110 via a command/address bus (i.e., CA1) and a data bus (i.e., DQ1). Bus CA1 comprises P number of signal lines. Bus DQ1 comprises Q number of signal lines. Together, command/address bus CA1 and data bus DQ1 comprise a second memory channel 112.

In an embodiment, controller 110 is configured to store and retrieve data blocks in at least a portion of the memory space of memory channel 111. Controller 110 is also configured to store and retrieve repair tag blocks in at least a portion of the memory space of memory channel 112. When controller 110 accesses a data block from memory channel 111, controller 111 receives at least a data field and a repair field that are part of the data block. When controller 110 accesses repair tag block, from memory channel 112, controller 110 receives at least a first address field that indicates at least a first portion of the data field to be replaced by a first portion of the repair field.

Controller 110 may be configured to access a data block via memory channel 111 while concurrently accessing and associated repair tag block the memory channel 112. Controller 110 may map the address of the data block on memory channel 111 to an address of the associated repair tag block on memory channel 112. For example, when accessing data blocks on memory channel 111, controller 110 may map multiple column addresses (e.g., 15) on memory channel 111 into a single column address on memory channel 112 (e.g., 1) to access the associated repair tag block. In other words, the same repair tag block is used to provide repair tags for multiple data blocks.

Controller 110 can be configured to allocate portions of each data block to store data for different purposes. For example, controller 110 may allocate part of the data block as a primary data storage area. Another part of the data block can be allocated as a data repair element area. Finally, yet another part of the data block may be allocated to hold error correction code information. Likewise, controller 110 can allocate portions of a repair tag block to store data for different purposes. For example, controller 110 may allocate a portion of a repair tag block to store repair tags. In particular, controller 110 may allocate a portion of a repair tag block to hold information that allows controller 110 to substitute data repair elements in a data block for primary data storage elements in that same data block.

For example, controller 110 may store repair tags which associate the repair tag with a particular data block. The repair tags can also associate a location in the primary data storage area of that particular data block with a location in the repair element area of that data block. In other words, repair tags stored in a repair tag block can be used to specify, for a given data block, the substitution of a repair data element for a location in the primary data storage area. Repair tags may also include information that specifies whether or not the particular repair tag entry is valid (i.e. whether a substitution should be made using the information stored in the repair tag).

Memory system 100 is described herein with reference to two memory channels (e.g., memory channel 111 and memory channel 112.) However, it should be understood that in an embodiment (e.g., an embodiment where controller 110 has only one memory channel interface), data block and repair tag block accesses can be made on the same memory channel, but at different times and to different addresses. The accesses of a data block and a corresponding repair tag block on the same memory channel may be made to the same, or different, modules (e.g., modules 120). Accordingly, it should be understood that the embodiments described herein in terms of accesses that occur via more than one memory channel should also be understood to describe embodiments whereby accesses to the data block and the corresponding repair tag block occur on the same memory channel.

Figure 2:
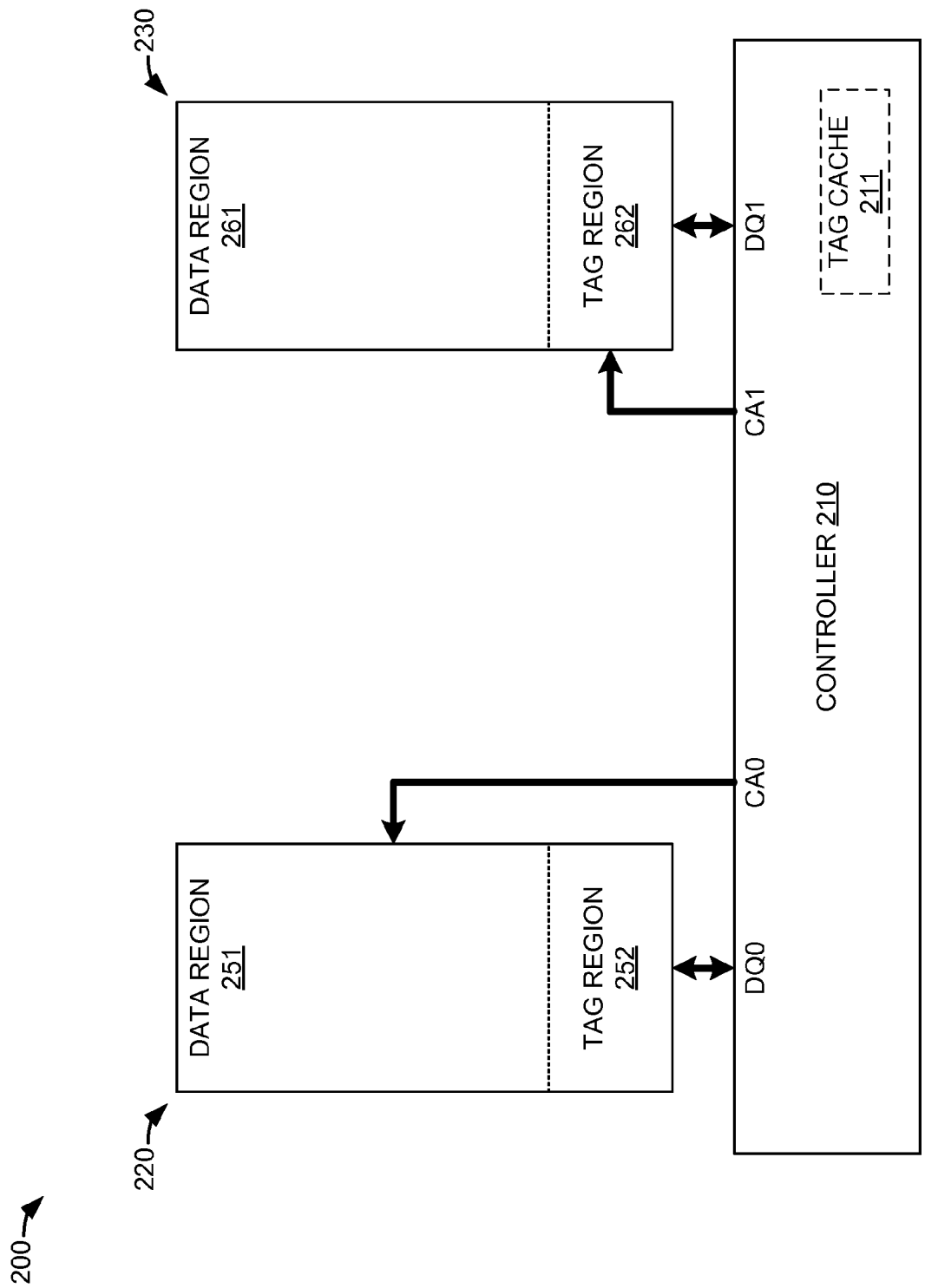
FIG. 2 is a block diagram illustrating a memory space allocation.

FIG. 2 is a block diagram illustrating a memory space allocation. In FIG. 2, memory system 200 comprises controller 210, memory space 220, and memory space 230. Controller 210 is operatively coupled to memory space 220 via a first memory channel comprising command/address bus (CA0) and a data bus (DQ0). Controller 210 is operatively coupled to memory space 230 via a second memory channel comprising a command/address bus (CA1) and a data bus (DQ1). Controller 210 may optionally include tag cache 211. Memory space 220 may address one or more DRAM memory modules (e.g., modules 120) accessed via a memory channel (e.g., memory channel 111). Memory space 230 may address one or more DRAM memory modules (e.g., modules 130) accessed via a memory channel (e.g., memory channel 112).

Memory space 220 is divided into a data region 251 and a tag region 252. Memory space 230 is divided into a data region 261 and tag region 262. In an embodiment, when controller 210 accesses a data block in data region 251, controller 210 concurrently accesses an associated repair tag block in tag region 262. Likewise, when controller 210 accesses a data block in data region 261, controller 210 concurrently accesses an associated repair tag block in tag region 252.

Data region 251 and data region 261 can be allocated by controller 210 to be an integer multiple times larger than tag region 252 and tag region 262, respectively. For example, data region 251 can be allocated by controller 210 to be 15 times larger than tag region 252. Likewise, data region 261 can be 15 times larger than tag region 262. In this example, one $16^{th}$ of memory space 220 and memory space 230 are allocated to holding repair tag data blocks. The rest of memory space 220 and memory space 230 are allocated to holding data blocks.

Tag cache 211 may optionally hold information from tag region 252 and/or 262. By caching information from tag region 252 and/or 262, some accesses to tag region 252 and tag region 262 may be avoided—thereby saving power.

Figure 3:
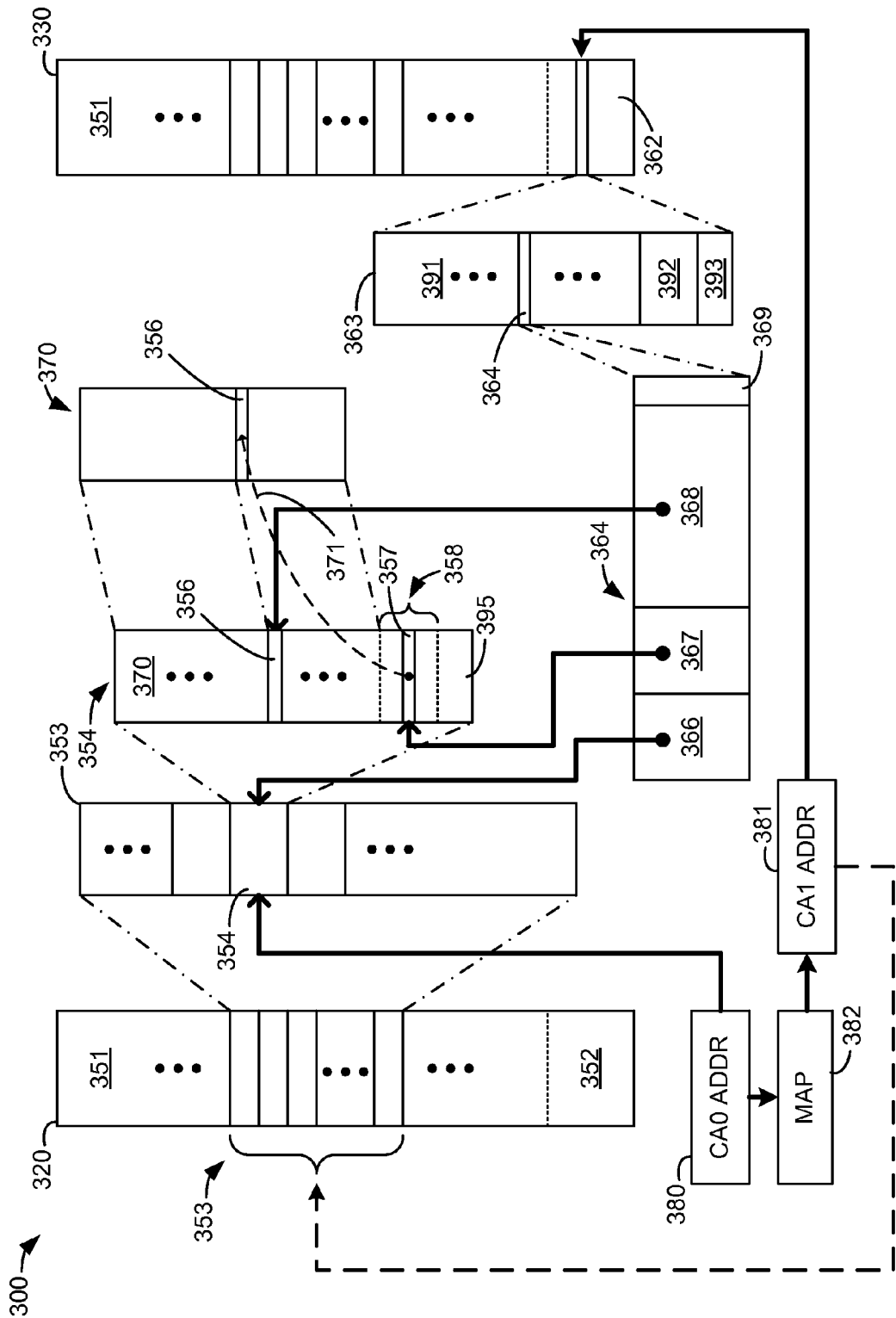
FIG. 3 is a diagram illustrating the use of repair tags to repair a data element.

FIG. 3 is a diagram illustrating the use of repair tags to repair a data element. In FIG. 3, data element repair 300 comprises data block address 380, data block address to repair tag block address map 382, repair tag block address 381, memory space 320, and memory space 330. Memory address space 330 includes data region 361 and tag region 362. Memory address space 320 includes data region 351 and tag region 352.

A repair tag block 363 is referenced by repair tag block address 381. Repair tag block 363 includes repair tags 391, a reserved area 392, and an error correcting code 393. Repair tags 391 include repair tag 364. Repair tag 364 includes block address field 366, repair element address field 367, data element address field 368, and enable field 369.

Repair tag block 363 may be the repair tag block for a data block group 353. This is illustrated in FIG. 3 by the dashed line from repair tag address 381 to the data block group 353 in data region 351. Data block group 353 includes a data block 354 that is referenced by data block address 380. Data block 354 includes primary data elements (a.k.a., data field) 370, repair elements (a.k.a., repair field) 358, and error correcting code 395. Primary data elements 370 includes data element 356. Repair elements 358 includes repair element 357.

The operations resulting a data repair will now be described with reference to FIG. 3. In this description, data element 356 in data block 354 is replaced with repair element 357 from data block 354 using information from repair tag 364 in repair tag block 363.

A controller retrieves a data block 354 using a data block address 380 for a data block stored in a memory space 320 accessed via a first memory channel. For example, controller 110 may access a data block via memory channel 111. The arrow from data block address 380 pointing to data block 354 indicates the referencing of data block 354 by data block address 380. Data block 354 is part of data block group 353 which lies in data region 351. Data region 351 is part of memory space 320.

The controller maps the data block address 380 (which is an address on the first memory channel—e.g., memory channel 111) to a repair tag block address (which is an address on a second memory channel—e.g., memory channel 112). The arrow from data block address 380 to map 382 and the arrow from map 382 to repair tag address 381 illustrates the mapping of a data block address 380 to a repair tag block address 381.

The controller retrieves a repair tag block 363 using a repair tag block address 381. Repair tag block address 381 references a repair tag block 363 stored in a memory space 330 accessed via a second memory channel. For example, controller 110 may access a repair tag block via memory channel 112. The arrow from repair tag block address 381 pointing to repair tag block 363 indicates the referencing of repair tag block 363 by repair tag block address 381. Repair tag block 363 lies in tag region 362 which is part of memory space 330.

The controller searches the repair tags 391 in repair tag block 363 to determine whether any of any repair tags 391 reference data block 354. The controller searches repair tags 391 by examining the enable field to determine whether a repair tag is holding valid information and, if a repair tag 391 is valid, comparing the block address field 366 to the portion of block address 380 that distinguishes between data blocks in data block group 353. If none of the repair tags 391 reference data block 354, then data block 354 does not need to be repaired. However, as illustrated in FIG. 3, repair tag 364 references data block 354. The arrow from block address field 366 of repair tag 364 pointing to data block 354 indicates the referencing of data block 354 by repair tag 364.

After determining that repair tag 364 references data block 354, the controller uses the information in repair tag 364 to replace a data element 356 with a repair element 357. The arrow from data element address field 368 pointing to data element 356 indicates the referencing, for replacement, of data element 356 by data element address field 368. The arrow from repair element address field 367 pointing to repair element 357 indicates repair element 357 is to be the replacement for data element 356. Arrow 371 from repair element 357 to data element 356 in primary data elements 370 indicates the replacement (functionally) of data element 356 by repair element 357 that is done by the controller (e.g., controller 110 or controller 210).

Figure 4:
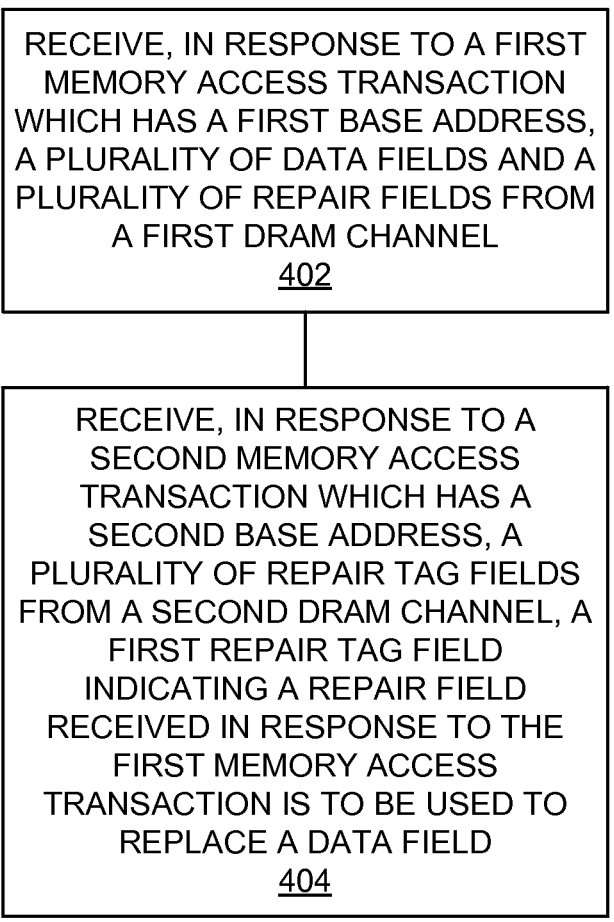
FIG. 4 is a flowchart of a method of selecting repair data.

FIG. 4 is a flowchart of a method of selecting repair data. The steps illustrated in FIG. 4 may be performed by one or more elements of memory system 100 and/or memory system 100. In response to a first memory access transaction which has a first base address, a plurality of data fields and a plurality of repair fields are received from a first DRAM channel (402). For example, in response to a memory access transaction on memory channel 111 to a data region on memory channel 111, controller 110 may receive a data block (e.g., data block 354) that has data fields (e.g., primary data elements 370) and repair fields (e.g., repair elements 358).

In response to a second memory access transaction which has a second base address, a plurality of repair tag fields are received from a second DRAM channel. A first of these repair tag fields indicating that a repair field received in response to the first memory transaction is to replace a data field received in response to the first memory transaction (404). For example, in response to a memory access transaction on memory channel 112 to a tag region on memory channel 112, controller 110 may receive a repair tag block (e.g., repair tag block 363) that has a plurality of repair tag fields (e.g., repair tags 391). At least one of these repair tags (e.g., repair tag 364) may indicate that a data element (e.g., data element 356) is to be repaired by replacing that data element with a repair element (e.g. repair element 357).

Figure 5:
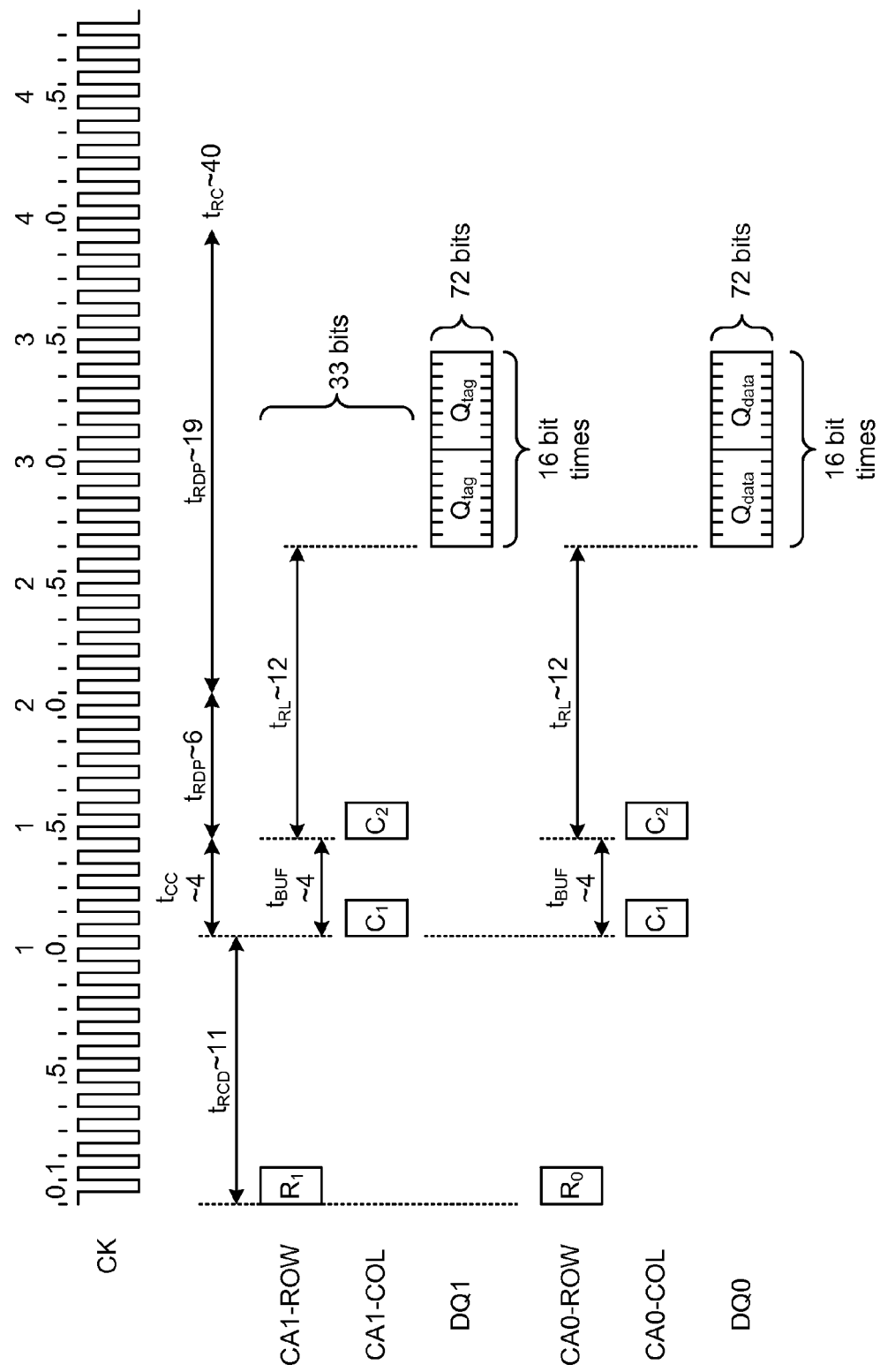
FIG. 5 is a timing diagram illustrating a repair tag block and data block read transaction.

FIG. 5 is a timing diagram illustrating a repair tag block and data block read transaction. The sequence illustrated in FIG. 5 begins with row addresses being output concurrently on two memory channels. Row address $R_0$ is output on CA0 and row address $R_1$ is output on CA1. After the appropriate (as determined by the specifications of the memory channel) delay, a first column address is output concurrently on the two memory channels. In FIG. 5, column address $C_1$ is output on both CA0 and CA1 $t_{RCD}$ (approx. 11 CK cycles) after the row addresses $R_1$ and $R_2$ were output.

After the appropriate delay, a second column address is output concurrently on the two memory channels. In FIG. 5, column address $C_2$ is output on both CA0 and CA1 $t_{BUF}$ (approx. 4 CK cycles) after the column address $C_1$ was output. In response to the row address $R_0$ and column addresses $C_1$ and $C_2$, and after an appropriate delay, a first memory channel returns a data block. In response to the row address $R_1$ and column addresses $C_1$ and $C_2$, and after the same delay, a second memory channel returns a data block. In FIG. 5, in response to row address $R_0$ on CA0, and $C_1$ and $C_2$ on CA0, $Q_{data}$ is returned on DQ0. $Q_{data}$ represents two data blocks (e.g., data block 354) each comprising 8 bit times (i.e., unit intervals) of 72 bits of data. In response to row address $R_1$ on CA1, and $C_1$ and $C_2$ on CA1, $Q_{tag}$ is returned on DQ1. $Q_{tag}$ represents two tag repair blocks (e.g., tag repair block 363) each comprising 8 bit times (i.e., unit intervals) of 72 bits of data. In FIG. 5, the delay from C2 being output to $Q_{data}$ and $Q_{tag}$ being returned is $t_{RL}$ (approx. 12 CK cycles).

Figure 6:
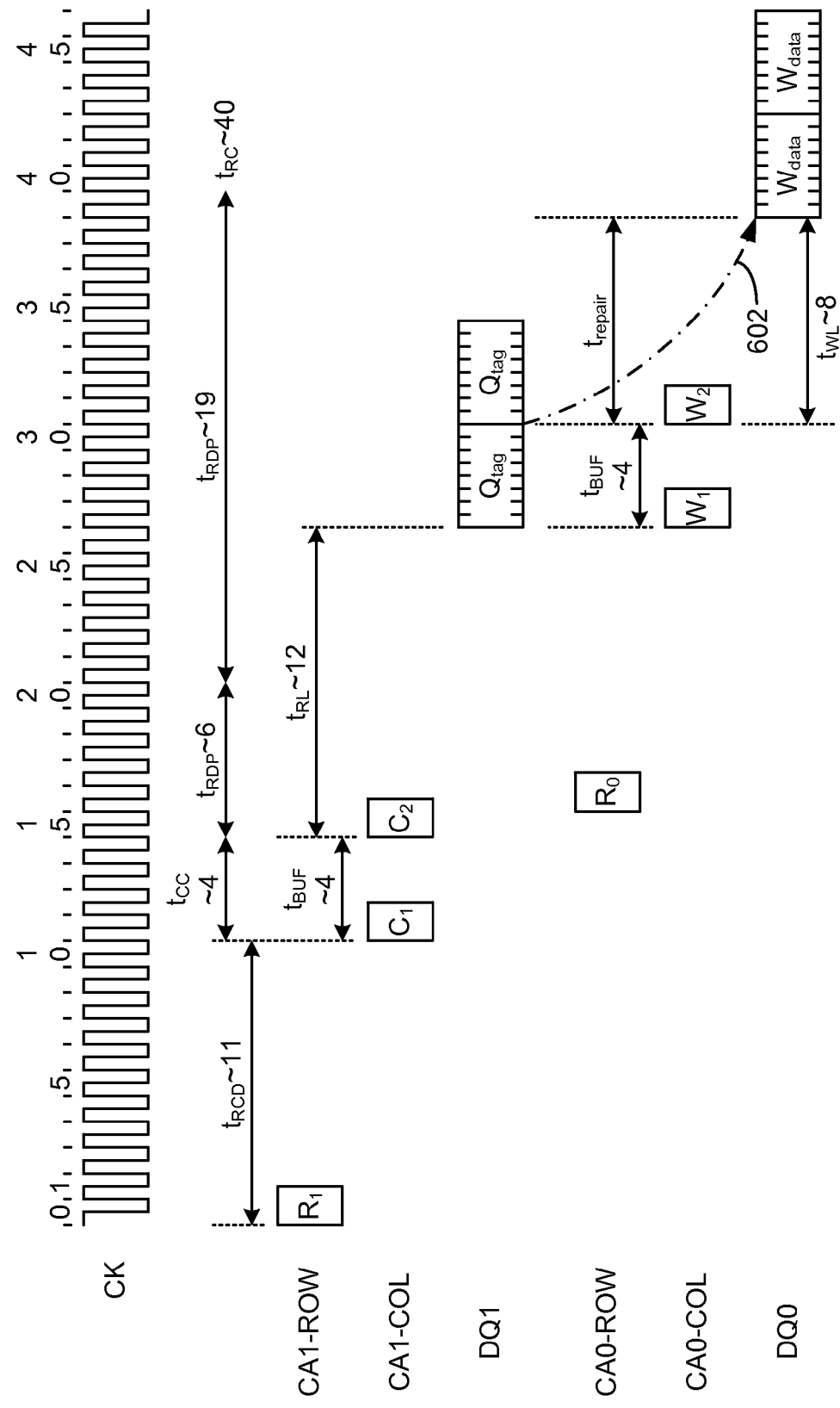
FIG. 6 is a timing diagram illustrating a repair block tag and data block write transaction.

FIG. 6 is a timing diagram illustrating a repair tag block and data block write transaction. The sequence illustrated in FIG. 6 begins with a row address being output on the tag memory channel. Row address $R_1$ is output on CA1. After the appropriate (as determined by the specifications of the memory channel) delay, a first column address is output on the tag memory channel. In FIG. 6, column address $C_1$ is output on CA1 $t_{RCD}$ (approx. 11 CK cycles) after the row addresses $R_1$ was output.

After the appropriate delay, a second column address is output on the tag memory channel. In FIG. 5, column address $C_2$ is output on CA1 $t_{BUF}$ (approx. 4 CK cycles) after the column address $C_1$ was output. At an appropriate time before $Q_{tag}$ is to arrive from the first memory channel (as determined by the specifications of the memory channel and the time needed by the controller to replace data elements with repair elements), a row address is output on the data memory channel. In FIG. 6, row address $R_0$ is output on CA0 before $Q_{tag}$ is to arrive on DQ1.

In response to the row address $R_1$, column addresses $C_1$ and $C_2$, and after an appropriate delay, a first memory channel returns a repair tag block. In FIG. 6, $Q_{tag}$ is returned on DQ1 $t_{RL}$ (approx. 12 CK cycles) after $C_2$ was output. Column write addresses are output on the data memory channel. In FIG. 6, column write address $W_1$ is output on CA0 followed by $W_2$ $t_{BUF}$ (approx. 4 CK cycles) after the column write address $W_1$ was output.

After an amount of time necessary to integrate altered (or new) tags into the first tag data block received as part of $Q_{tag}$ (e.g., $t_{repair}$), tag write data is output to the data memory channel. In FIG. 6, $W_{data}$ is output on DQ0 $t_{WL}$ (approx. 8 CK cycles) after $W_2$ was output.

Figure 7:
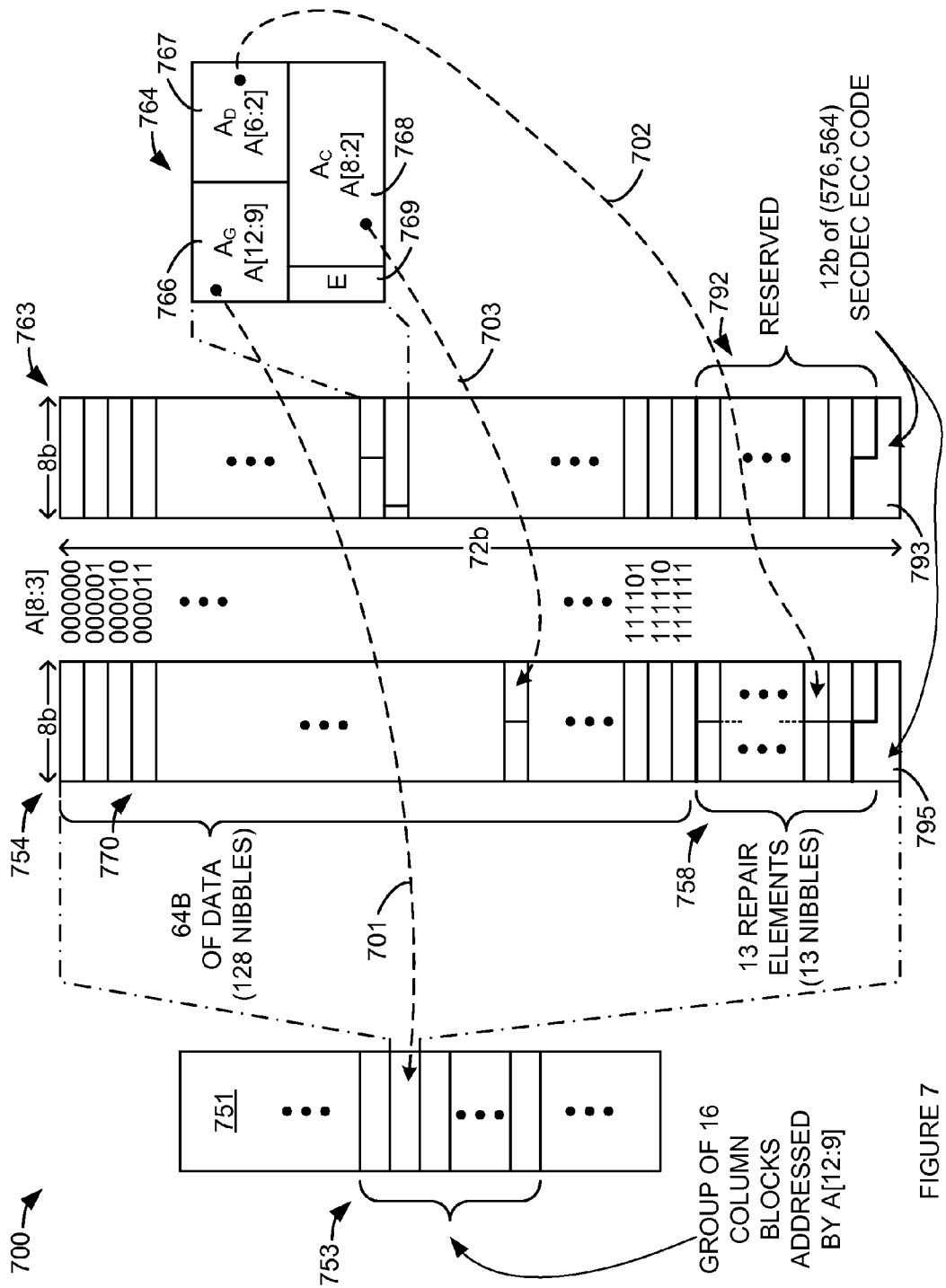
FIG. 7 illustrates formats for a data block, repair tag block, and a repair tag.

FIG. 7 illustrates formats for a data block, repair tag block, and a repair tag. In FIG. 1, formats 700 illustrated include data region 751, data block (a.k.a., column block) 754, repair tag block 763, and repair tag 764. Data region 751 includes a plurality of groups of data blocks. These groups of data blocks include data block group 753. Each of these groups of data blocks includes 16 data blocks which are addressed by address bits A[12:9]. Each data block may be associated with (e.g., addressed by) a single column address to a memory module (e.g., modules 120).

Data block 754 is illustrated as 72 rows that are eight bits wide. In data block 754 there are 64 bytes of data elements 770. Each of these bytes consists of two 4-bit nibbles. Also in data block 754, there are 13 repair elements 758. Each of the 13 repair elements consists of a single four bit nibble. Data block 754 also includes 12 bits of (576, 564) SECDEC EDC protection for the entire contents of data block 754.

Repair tag block 763 is also illustrated as 72 rows that are eight bits wide. In repair tag block 763 there are 64 bytes of repair tags 764. Each repair tag 764 consists of two bytes. Thus there are 32 repair tags 764 in repair tag block 763. Repair tag block 763 also includes 12 bits of (576, 564) SECDEC EDC protection for the entire contents of repair tag block 763. Repair tag block 763 has six bytes and one nibble that are reserved/unused. In an embodiment, all or part of these unused parts of repair tag block could be used as a signature to protect (e.g., detect) addressing (C/A bus) errors on the memory channel.

Repair tag 764 include fields to hold: (1) an enable bit (E 769) which indicates whether the repair tag 764 is valid; (2) 4-bits that associate a data block 754 from a data block group 753 to the repair tag 764 ($A_G$ 766); (3) 4-bits that reference a repair element 758 to be used to replace a data 770 nibble ($A_D$ 767); and, (4) 7-bits that reference the data 770 nibble to be functionally replaced by the repair element 758 referenced by $A_D$ ($A_C$ 768). To associate the repair tag 764 to the particular data block 754 from a data block group 753, field $A_G$ 766 may store address bits A[12:9] of the particular data block 754. To reference a repair element 758 nibble to be used to replace a data 770 nibble, field $A_D$ 767 may store address bits A[6:2] of the memory space encompassed by the particular data block 754. To reference the data 770 nibble to be functionally replaced by the repair element 758 nibble, field $A_C$ may store address bits A[8:2] of the memory space encompassed by the particular data block 754.

In FIG. 7, the association of repair tag 764 to a particular data block 754 from a data block group 753 by field $A_G$ 766 is illustrated by arrow 701 from field $A_G$ 766 to a data block 754 of a group of data blocks 753. Field $A_D$ 767's reference to a repair element 758 nibble to be used to replace a data 770 nibble is illustrated by arrow 702 from field $A_D$ 767 to a repair element 758 nibble in data block 754. Field $A_C$ 768's reference to a data 770 nibble to be replaced by the repair element 758 nibble is illustrated by arrow 703 from field $A_C$ 768 to a data 770 nibble in data block 754.

Figure 8:
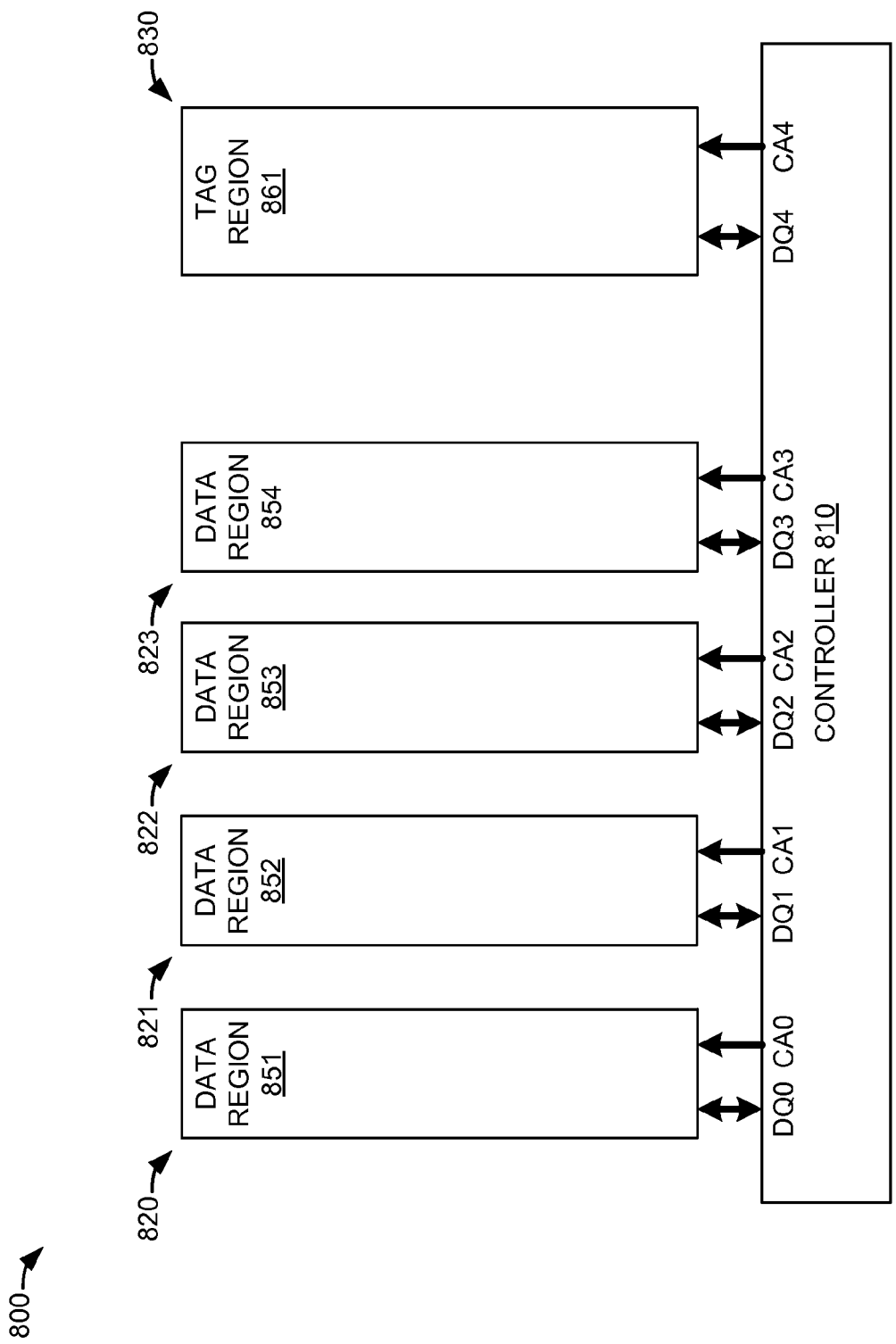
FIG. 8 is a block diagram illustrating a memory system.

FIG. 8 is a block diagram illustrating a memory system. In FIG. 8, memory system 800 comprises controller 810, memory space 820, memory space 821, memory space 822, memory space 823, and memory space 830. Controller 810 is operatively coupled to memory space 820 via a first memory channel comprising command/address bus (CA0) and a data bus (DQ0). Controller 810 is operatively coupled to memory space 821 via a second memory channel comprising command/address bus (CA1) and a data bus (DQ1). Controller 810 is operatively coupled to memory space 822 via a third memory channel comprising command/address bus (CA2) and a data bus (DQ2). Controller 810 is operatively coupled to memory space 821 via a fourth memory channel comprising command/address bus (CA3) and a data bus (DQ3). Controller 810 is operatively coupled to memory space 830 via a fourth memory channel comprising a command/address bus (CA1) and a data bus (DQ1). Memory space 820, memory space 821, memory space 822, memory space 823 may address one or more DRAM memory modules (e.g., modules 120) accessed via a respective memory channel (e.g., memory channel 111). Memory space 830 may address one or more DRAM memory modules (e.g., modules 130) accessed via a memory channel (e.g., memory channel 112).

Memory space 820 includes data region 851. Memory space 821 includes data region 852. Memory space 822 includes data region 853. Memory space 823 includes data region 854. Memory space 830 includes tag region 862. In an embodiment, when controller 810 accesses a data block in data region 851, data region 852, data region 853, or data region 854, controller 810 concurrently accesses an associated repair tag block in tag region 862. In an embodiment, memory space 820, memory space 821, memory space 822, memory space 823, and memory space 830 may be comprised of 64-bit memory modules. Memory space 830 may be comprised of fewer memory modules than memory space 820, memory space 821, memory space 822, and/or memory space 823. For example, memory space 820, memory space 821, memory space 822, and/or memory space 823 may be able to accommodate up to four modules each. However, memory space 830 may have fewer than 4 modules and be able to store enough repair tag blocks to provide for data repair of the modules on memory space 820, memory space 821, memory space 822, and memory space 823.

The systems and devices described above may be implemented in computer systems, integrated circuits, or stored by computer systems. The systems described above may also be stored on a non-transitory computer readable medium. Devices, circuits, and systems described herein may be implemented using computer-aided design tools available in the art, and embodied by computer-readable files containing software descriptions of such circuits. This includes, but is not limited to, one or more elements of memory system 100, memory system 200, data repair element 300, formats 700, and memory system 800, and their components. These software descriptions may be: behavioral, register transfer, logic component, transistor, and layout geometry-level descriptions. Moreover, the software descriptions may be stored on non-transitory storage media or communicated by carrier waves.

Data formats in which such descriptions may be implemented include, but are not limited to: formats supporting behavioral languages like C, formats supporting register transfer level (RTL) languages like Verilog and VHDL, formats supporting geometry description languages (such as GDSII, GDSIII, GDSIV, CIF, and MEBES), and other suitable formats and languages. Moreover, data transfers of such files on machine-readable media may be done electronically over the diverse media on the Internet or, for example, via email. Note that physical files may be implemented on machine-readable media such as: 4 mm magnetic tape, 8 mm magnetic tape, 3½ inch floppy media, CDs, DVDs, Blu-Ray, and so on.

Figure 9:
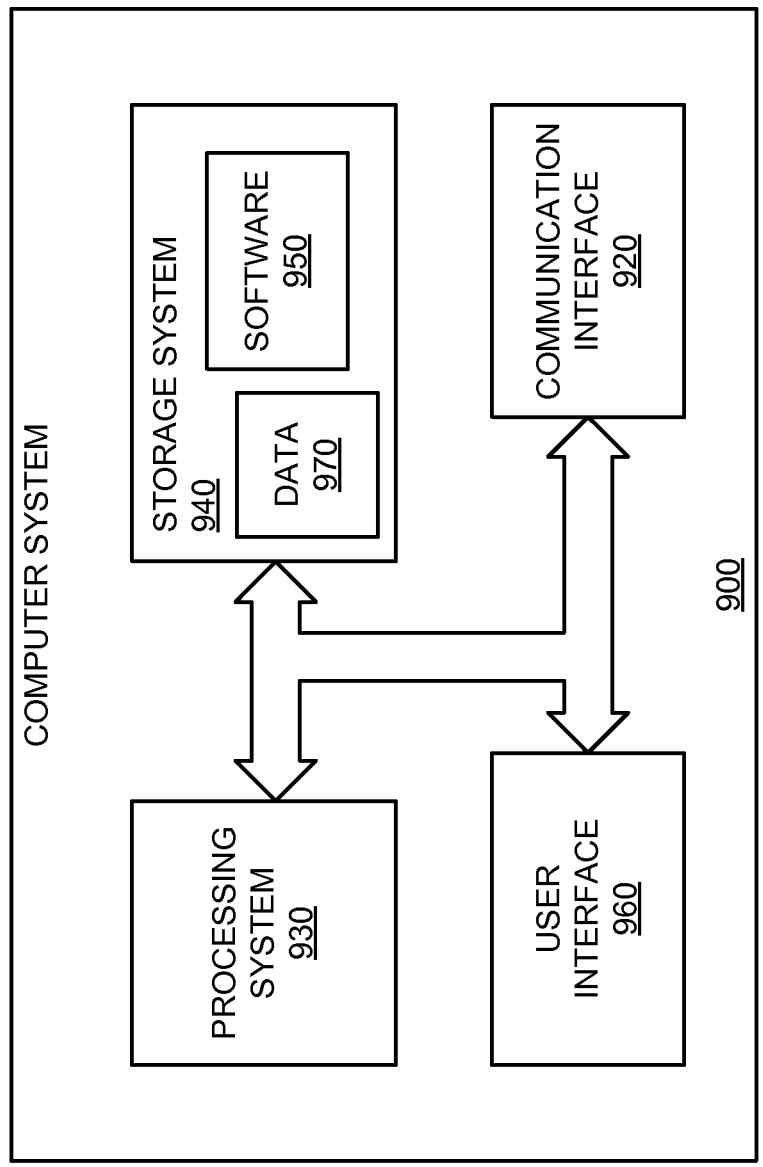
FIG. 9 is a block diagram of a computer system.

FIG. 9 illustrates a block diagram of a computer system. Computer system 900 includes communication interface 920, processing system 930, storage system 940, and user interface 960. Processing system 930 is operatively coupled to storage system 940. Storage system 940 stores software 950 and data 970. Computer system 900 may include one or more of memory system 100, memory system 200, data repair element 300, formats 700, and memory system 800, or components that implement the methods, circuits, and/or waveforms described herein. Processing system 930 is operatively coupled to communication interface 920 and user interface 960. Computer system 900 may comprise a programmed general-purpose computer. Computer system 900 may include a microprocessor. Computer system 900 may comprise programmable or special purpose circuitry. Computer system 900 may be distributed among multiple devices, processors, storage, and/or interfaces that together comprise elements 920-970.

Communication interface 920 may comprise a network interface, modem, port, bus, link, transceiver, or other communication device. Communication interface 920 may be distributed among multiple communication devices. Processing system 930 may comprise a microprocessor, microcontroller, logic circuit, or other processing device. Processing system 930 may be distributed among multiple processing devices. User interface 960 may comprise a keyboard, mouse, voice recognition interface, microphone and speakers, graphical display, touch screen, or other type of user interface device. User interface 960 may be distributed among multiple interface devices. Storage system 940 may comprise a disk, tape, integrated circuit, RAM, ROM, EEPROM, flash memory, network storage, server, or other memory function. Storage system 940 may include computer readable medium. Storage system 940 may be distributed among multiple memory devices.

Processing system 930 retrieves and executes software 950 from storage system 940. Processing system 930 may retrieve and store data 970. Processing system 930 may also retrieve and store data via communication interface 920. Processing system 930 may create or modify software 950 or data 970 to achieve a tangible result. Processing system 930 may control communication interface 920 or user interface 960 to achieve a tangible result. Processing system 930 may retrieve and execute remotely stored software via communication interface 920.

Software 950 and remotely stored software may comprise an operating system, utilities, drivers, networking software, and other software typically executed by a computer system. Software 950 may comprise an application program, applet, firmware, or other form of machine-readable processing instructions typically executed by a computer system. When executed by processing system 930, software 950 or remotely stored software may direct computer system 900 to operate.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A memory system, comprising:
a first memory channel configured to receive at least a first memory module;
a second memory channel configured to receive at least a second memory module; and,
a controller having a first interface connected to the first memory channel and a second interface connected to the second memory channel, the controller configured to couple a first access on the first memory channel directed to a first memory address space to a second access on the second memory channel directed to a second memory address space, the first access receives a data field and a repair field, the second access receives at least a first address field to indicate at least a first portion of the data field to be replaced by a first portion of the repair field.

2. The memory system of claim 1, wherein the first access on the first memory channel and the second access on the second memory channel are DRAM read transactions.

3. The memory system of claim 2, wherein the first access on the first memory channel and the second access on the second memory channel are coupled by a mapping of the first address space to the second address space.

4. The memory system of claim 2, wherein the first access on the first memory channel and the second access on the second memory channel are coupled by occurring concurrently.

5. The memory system of claim 1, wherein the data field and the repair field of the first access are to be received by the controller concurrently with the at least one address field of the second access.

6. The memory system of claim 1, wherein the data field comprises a plurality of portions of the data field, the plurality of portions of the data field including the first portion of the data field, the repair field comprising a plurality of portions of the repair field, the plurality of portions of the repair field including the first portion of the repair field, the second access to receive a plurality of address fields, the plurality of address fields including the first address field.

7. The memory system of claim 6, wherein the first access is also to receive a first error detect and correct (EDC) code field that is to detect and correct errors in the data field and in the repair field.

8. The memory system of claim 6, wherein the second access is also to receive a second error detect and correct (EDC) code field that is to detect and correct errors in the plurality of address fields.

9. A memory controller, comprising:
a first interface configured to be connected to a first DRAM memory channel;
a second interface configured to be connected to a second DRAM memory channel; and,
repair logic to replace a first data field of a plurality of data fields with a first repair field of a plurality of repair fields, the plurality of data fields and the plurality of repair fields to be received via the first DRAM memory channel in response to a first memory access transaction, the first repair field to be indicated by a first address field of a plurality of address fields, the plurality of address fields to be received via the second DRAM memory channel in response to a second memory access transaction, the first memory access transaction directed to a first memory address space of the first DRAM memory channel, the second memory access transaction directed to a second memory address space of the second DRAM memory channel.

10. The memory controller of claim 9, further comprising:
error detect and correct logic to receive an EDC code field received via the first DRAM memory channel in response to the first memory access transaction, the error detect and correct logic to use information in the EDC code field to correct at least a first bit error in the plurality of data fields and the plurality of repair fields.

11. The memory controller of claim 9, wherein the first memory address space of the first DRAM memory channel has a first size and the second memory address space has a second size, the first size is an integer multiple of the second size, the integer multiple is at least eight.

12. The memory controller of claim 9, wherein the first memory access transaction and the second memory access transaction are directed to the same bank address.

13. The memory controller of claim 9, wherein the first memory access transaction and the second memory access transaction are directed to the same rank address.

14. The memory controller of claim 9, wherein the first memory access transaction and the second memory access transaction are directed to the same module address.

15. A method of operating a memory controller, comprising:
receiving, by a memory controller, via a first interface connected to a first DRAM memory channel and in response to a first memory access transaction having a first base address, a plurality of data fields and a plurality of repair fields, the plurality of data fields including a first data field, the plurality of repair fields including a first repair field storing first repair data, the first repair data corresponding to the first data field, the first memory access transaction directed to a first memory address space of the first DRAM memory channel; and, receiving, by the memory controller, via a second interface connected to a second DRAM memory channel and in response to a second memory access transaction having a second base address, a plurality of repair tag fields, the plurality of repair tag fields including a first repair tag field that indicates the first repair data is to be used to replace data stored in the first data field, the second memory access transaction directed to a second memory address space of the second DRAM memory channel.

16. The method of claim 15, wherein the second memory access transaction corresponds to the first memory transaction by a mapping of the first base address to the second base address.

17. The method of claim 16, wherein the second base address maps to a plurality of base addresses on the first DRAM memory channel, the second base address mapping to the second DRAM memory channel.

18. The method of claim 17, wherein the first memory access transaction and the second memory access transaction are performed concurrently.

19. The method of claim 17, further comprising:
correcting a bit error in at least one of said plurality of data fields and said plurality of repair fields from said first DRAM memory channel using error correct and detect information from an error correct and detect field received in response to the first memory access transaction.

20. The method of claim 17, further comprising:
correcting a bit error in at least one of said plurality of repair tag fields from said second DRAM memory channel using error correct and detect information from an error correct and detect field received in response to the second memory access transaction.

* * * * *